United States Patent
He

(10) Patent No.: US 12,166,580 B2
(45) Date of Patent: *Dec. 10, 2024

(54) DATA TRANSMISSION METHOD AND APPARATUS WITH FORWARD ERROR CORRECTION CODE TYPE CONVERSION

(71) Applicant: Huawei Technologies Co., Ltd., Shenzhen (CN)

(72) Inventor: Xiang He, Beijing (CN)

(73) Assignee: HUAWEI TECHNOLOIGES CO., LTD., Shenzhen (CN)

( * ) Notice: Subject to any disclaimer, the term of this patent is extended or adjusted under 35 U.S.C. 154(b) by 117 days.

This patent is subject to a terminal disclaimer.

(21) Appl. No.: 17/525,178

(22) Filed: Nov. 12, 2021

(65) Prior Publication Data

US 2022/0077958 A1   Mar. 10, 2022

Related U.S. Application Data

(63) Continuation of application No. PCT/CN2019/087058, filed on May 15, 2019.

(51) Int. Cl.
*H04L 1/00* (2006.01)
*H03M 13/00* (2006.01)
(Continued)

(52) U.S. Cl.
CPC ...... *H04L 1/0064* (2013.01); *H03M 13/1515* (2013.01); *H03M 13/2906* (2013.01); *H04L 1/0057* (2013.01); *H04L 1/0061* (2013.01)

(58) Field of Classification Search
CPC ............... H04W 52/48; H04B 7/15528; H04B 7/15521; H04L 1/0009; H04L 1/0064;
(Continued)

(56) References Cited

U.S. PATENT DOCUMENTS 5,699,367 A * 12/1997 Haartsen ............... H04L 1/1809
714/749
5,841,378 A  11/1998 Klayman et al.
(Continued)

FOREIGN PATENT DOCUMENTS

CN  1489308 A  4/2004
CN  1538315 A  10/2004
(Continued)

OTHER PUBLICATIONS

ITU-T G.975, Telecommunication Standardization Sector of ITU, "Series G: Transmission Systems and Media, Digital Systems and Networks Digital sections and digital line system—Optical fibre submarine cable systems, Forward error correction for submarine systems," Oct. 2000, 21 pages.
(Continued)

*Primary Examiner* — Justin R Knapp
(74) *Attorney, Agent, or Firm* — Conley Rose, P.C.

(57) ABSTRACT

In a data transmission method, a first chip receives a first data stream sent by a second chip, where the first data stream is a data stream obtained through encoding by using a first forward error correction (FEC) code type; and the first chip encodes the first data stream at least once, to obtain a second data stream, where the second data stream is a concatenated FEC code stream obtained through encoding by using at least the first FEC code type and a second FEC code type.

31 Claims, 8 Drawing Sheets

(51) Int. Cl.
*H03M 13/15* (2006.01)
*H03M 13/29* (2006.01)

(58) Field of Classification Search
CPC .............. H04L 1/0057; H04L 1/0061; H03M 13/1515; H03M 13/2906
See application file for complete search history.

(56) References Cited

U.S. PATENT DOCUMENTS

| | | | |
|---|---|---|---|
| 7,418,644 | B2 | 8/2008 | Smith et al. |
| 9,325,350 | B2 | 4/2016 | Prodan |
| 9,450,616 | B2 | 9/2016 | Zhang et al. |
| 10,630,430 | B2 * | 4/2020 | Kalhan ................ H04L 5/0055 |
| 10,804,999 | B2 * | 10/2020 | Kalhan ............. H04B 7/15528 |
| 10,848,270 | B2 * | 11/2020 | Pan ........................ H04B 10/50 |
| 10,903,937 | B2 * | 1/2021 | Smith ..................... H04B 10/50 |
| 2007/0104225 | A1 | 5/2007 | Mizuochi et al. |
| 2009/0122741 | A1 | 5/2009 | Chang et al. |
| 2009/0222709 | A1 | 9/2009 | Lin et al. |
| 2010/0146374 | A1 * | 6/2010 | Samuelson ............. C23F 13/22 713/323 |
| 2011/0173511 | A1 | 7/2011 | Miyata et al. |
| 2012/0020279 | A1 * | 1/2012 | Kim ................... H04B 7/15592 370/315 |
| 2012/0297266 | A1 | 11/2012 | Xu et al. |
| 2013/0216221 | A1 | 8/2013 | Zhang et al. |
| 2013/0311847 | A1 | 11/2013 | Miyata |
| 2014/0068385 | A1 | 3/2014 | Zhang et al. |
| 2014/0153625 | A1 | 6/2014 | Vojcic et al. |
| 2015/0162937 | A1 | 6/2015 | Zhang et al. |
| 2015/0180575 | A1 | 6/2015 | Bruckman |
| 2016/0080087 | A1 | 3/2016 | Koike-Akino et al. |
| 2016/0094311 | A1 | 3/2016 | Su et al. |
| 2016/0191277 | A1 | 6/2016 | Li et al. |
| 2017/0141912 | A1 | 5/2017 | Cech et al. |
| 2019/0068322 | A1 | 2/2019 | Smith et al. |
| 2019/0238212 | A1 * | 8/2019 | Kalhan ................ H04W 52/48 |
| 2020/0021313 | A1 | 1/2020 | Lu |
| 2020/0177307 | A1 * | 6/2020 | Pan ........................ H04L 1/0045 |

FOREIGN PATENT DOCUMENTS

| | | |
|---|---|---|
| CN | 101288255 A | 10/2008 |
| CN | 101667887 A | 3/2010 |
| CN | 102111233 A | 6/2011 |
| CN | 102130742 A | 7/2011 |
| CN | 102870361 A | 1/2013 |
| CN | 103797742 A | 5/2014 |
| CN | 104115435 A | 10/2014 |
| CN | 104426631 A | 3/2015 |
| CN | 104541452 A | 4/2015 |
| CN | 106688201 A | 5/2017 |
| CN | 107786305 A | 3/2018 |
| CN | 108667553 A | 10/2018 |
| EP | 1002272 B1 | 9/2008 |
| EP | 2346197 A2 | 7/2011 |
| EP | 3293908 A1 | 3/2018 |
| EP | 3595208 A1 | 1/2020 |
| JP | 2011146932 A | 7/2011 |
| JP | 2017509170 A | 3/2017 |
| JP | 2018133726 A | 8/2018 |
| WO | 2001095502 A1 | 12/2001 |
| WO | 2012164929 A1 | 12/2012 |
| WO | 2015178315 A1 | 11/2015 |
| WO | 2018177152 A1 | 10/2018 |
| WO | 2019026981 A2 | 2/2019 |

OTHER PUBLICATIONS

IEEE Std 802.3-2018, "IEEE Standard for Ethernet," IEEE Computer Society, Aug. 31, 2018, 5600 pages.
IEEE Std 802.3bs, 2017, IEEE Standard for Ethernet, "Amendment 10: Media Access Control Parameters, Physical Layers, and Management Parameters for 200 Gb/s and 400 Gb/s Operation," IEEE Computer Society, 372 pages.
IEEE Std 802.3 , 2005, "Part 3: Carrier Sense Multiple Access with Collision Detection (CSMA/CD) Access Method and Physical Layer Specifications," IEEE Standard for Information technology—Telecommunications and information exchange between systems, Local and metropolitan area networks, Specific requirements, 2595 pages.
Liu, H., et al., 802.3cu, "Towards 400GBASE-FR4 Baseline Proposal," IEEE 802.3 100G/lane optical PHYs Study Group, Mar. 2019, 10 pages.
Stassar, P., IEEE P802.3ct, "Baseline considerations for 100G and 400G DWDM objectives," Task Force, Vancouver, Mar. 2019, 18 pages.
Mike A. Sluyski et al., "Implementation Agreement for 400ZR," IA # OIF-400ZR 0.10-Draft IA for 400ZR, Nov. 2, 2018, 80 pages.
Gary Nicholl et al., "Inverse RS-FEC Baseline Proposal," IEEE P802.3ct Task Force, San Diego, Mar. 2019, 8 pages.

* cited by examiner

DATA TRANSMISSION METHOD AND APPARATUS WITH FORWARD ERROR CORRECTION CODE TYPE CONVERSION

CROSS-REFERENCE TO RELATED APPLICATIONS

This is a continuation of Int'l Patent App. No. PCT/CN2019/087058, filed May 15, 2019, which is incorporated by reference.

FIELD

This disclosure relates to the field of communications technologies, and in particular, to a data transmission method and apparatus.

BACKGROUND

A forward error correction (FEC) code can provide error correction protection for data that is being transmitted, so that a rate and a distance of transmitting data on a lane can be increased. In a data transmission process in which the FEC code is used, a sending device may encode original data by using a specific FEC code type, and then send encoded data to a receiving device. The receiving device may decode the received data by using the same FEC code type, to obtain the original data.

In some scenarios, the FEC code type may need to be converted in the data transmission process. For example, to adapt to high-rate and/or long-distance data transmission, when an original FEC code type used by an original data transmission interface cannot meet a data transmission requirement, the FEC code type needs to be converted, so that the original FEC code type is replaced with a higher-gain FEC code type. However, an FEC code type conversion process usually increases a delay in the data transmission process and power consumption of a data transmission device. This affects data transmission efficiency.

SUMMARY

In view of this, embodiments provide a data transmission method and apparatus, to simplify an FEC code type conversion process during data transmission, reduce a delay and device power consumption that are required during FEC code type conversion, and improve data transmission efficiency.

According to a first aspect, an embodiment provides a data transmission method. The method includes: A first chip receives a first data stream sent by a second chip, where the first data stream is a data stream obtained through encoding by using a first FEC code type; the first chip encodes the first data stream at least once, to obtain a second data stream, where the second data stream is a concatenated FEC code stream obtained through encoding by using at least the first FEC code type and a second FEC code type; and the first chip sends the second data stream to a third chip. It can be learned that, for the first data stream that is obtained through encoding by using the first FEC code type and that is sent by the second chip to the first chip, the first chip does not need to first decode the first data stream by using the first FEC code type and then original data into a higher-gain FEC code type. Instead, the first chip may encode the first data stream at least once by using at least the second FEC code type, to obtain the second data stream formed by concatenating at least the first FEC code type and the second FEC code type, so as to obtain a higher gain. Therefore, an FEC code type conversion process is simplified, both a delay and device power consumption that are required during FEC code type conversion are reduced, and data transmission efficiency is improved.

With reference to any implementation of the first aspect, in a first possible implementation of the first aspect, the first FEC code type is specifically: an RS code, a BCH code, a staircase code, an LDPC code, a Turbo code, or a turbo product code (TPC). It can be learned that the first chip may support encoding based on a plurality of different first FEC code types, to obtain a concatenated FEC code.

With reference to any implementation of the first aspect, in a second possible implementation of the first aspect, the second FEC code type is specifically: a BCH code, an RS code, a staircase code, an LDPC code, a Turbo code, or a TPC. It can be learned that the first chip may support encoding based on the first FEC code type and a plurality of different second FEC code types, to obtain a concatenated FEC code.

With reference to any implementation of the first aspect, in a third possible implementation of the first aspect, that the first chip encodes the first data stream at least once, to form a second data stream includes: The first chip distributes the first data stream, to form n third data streams, where data of a same codeword block in the first data stream is distributed to different third data streams; and the first chip encodes each of the plurality of third data streams at least once, to form the second data stream. It can be learned that the data in the same codeword block in the first data stream may be encoded into a plurality of different codeword blocks in the second data stream, so that the concatenated FEC code has a stronger error correction capability.

With reference to the third implementation of the first aspect, in a fourth possible implementation of the first aspect, k codeword blocks identified from the first data stream are distributed to the n third data streams, and data that belongs to the k codeword blocks in each of the third data streams is encoded into one codeword block in the second data stream; and a total data volume included in the k codeword blocks in the first data stream is equal to a payload data volume included in n codeword blocks in the second data stream. It can be learned that, because payloads in the n second codeword blocks are all data in the k codeword blocks, the n second codeword blocks may be directly decoded into the original data based on the second FEC code type and the first FEC code type. This helps perform decoding operations on a same chip based on the first FEC code type and the second FEC code type.

With reference to the third implementation of the first aspect, in a fifth possible implementation of the first aspect, data in the first data stream is distributed by FEC symbol block, and data in a same FEC symbol block in the first data stream is encoded into a same codeword block in the second data stream. It can be learned that the first chip may perform distribution processing on the first data stream at a symbol block granularity.

With reference to the third implementation of the first aspect, in a sixth possible implementation of the first aspect, data in the first data stream is distributed by bit stream, and data in the third data stream is encoded by bit stream. It can be learned that the first chip may perform distribution processing on the first data stream at a bit granularity.

With reference to any implementation of the first aspect, in a seventh possible implementation of the first aspect, the first chip and the second chip are located in a first data transmission device, the third chip is located in a second data transmission device, the first chip is an electrical chip, the second chip is a component that uses an Ethernet interface, and the third chip is an electrical chip. It can be learned that the first data transmission device may encode, by using the electrical chip, the first data stream that is based on the first FEC code type and that is output by the component using the Ethernet interface into the second data stream formed by concatenating at least the first FEC code type and the second FEC code type, and then send the second data stream to the second data transmission device. In this way, data is transmitted between the first data transmission device and the second data transmission device by using the concatenated FEC code.

With reference to any possible implementation of the first aspect, in an eighth possible implementation of the first aspect, the first data stream is transmitted between the second chip and the first chip through a physical link with interference. It can be learned that, for the first data stream in which an error occurs when the first data stream is transmitted through the physical link with interference, the first chip may directly encode the first data stream at least once without performing decoding and error correction on the first data stream, to form the concatenated second data stream.

According to a second aspect, an embodiment provides a data transmission method. The method includes: A first chip receives a second data stream sent by a second chip, where the second data stream is a concatenated FEC code stream obtained through encoding by using at least a first FEC code type and a second FEC code type; the first chip decodes the second data stream at least once, to form a first data stream, where the first data stream is a data stream obtained through encoding by using the first FEC code type; and the first chip sends the first data stream to a third chip. It can be learned that, for the second data stream that is formed by concatenating at least the first FEC code type and the second FEC code type and that is sent by the second chip to the first chip, the first chip may decode the second data stream by using an FEC code type other than the first FEC code type, to form the first data stream that is obtained through encoding by using the first FEC code type, and send the first data stream to the third chip. In this way, the first chip does not need to decode the second data stream into original data, then encoding the original data into a data stream that is based on the first FEC code type, and send the data stream to the third chip. Therefore, an FEC code type conversion process is simplified, both a delay and device power consumption that are required during FEC code type conversion are reduced, and data transmission efficiency is improved.

With reference to any possible implementation of the second aspect, in a first possible implementation of the second aspect, the first FEC code type is specifically: an RS code, a BCH code, a staircase code, an LDPC code, a Turbo code, or a TPC.

With reference to any possible implementation of the second aspect, in a second possible implementation of the second aspect, the second FEC code type is specifically: a BCH code, an RS code, a staircase code, an LDPC code, a Turbo code, or a TPC. It can be learned that the first chip may support decoding based on a plurality of different second FEC code types.

With reference to any possible implementation of the second aspect, in a third possible implementation of the second aspect, the first data stream is used to be decoded by the third chip based on the first FEC code type. It can be learned that the first chip may support decoding of a concatenated FEC code, to output a plurality of different first FEC code types.

With reference to any possible implementation of the second aspect, in a fourth possible implementation of the second aspect, the second chip is located in a first data transmission device, the first chip and the third chip are located in a second data transmission device, the first chip is an electrical chip, the second chip is a chip, and the third chip is a component that uses an Ethernet interface. It can be learned that, for the second data stream that is formed by concatenating at least the first FEC code type and the second FEC code type and that is sent by the first data transmission device to the second data transmission device, the first data transmission device may decode, by using the electrical chip based on the second FEC code type, the second data stream into the first data stream that is based on the first FEC code type, and then send the first data stream that is based on the first FEC code type to the component that uses the Ethernet interface. In this way, data is transmitted between the first data transmission device and the second data transmission device by using the concatenated FEC code.

With reference to any possible implementation of the second aspect, in a fifth possible implementation of the second aspect, the first data stream is transmitted between the first chip and the third chip by using a physical medium. It can be learned that the first chip does not decode the second data stream into the original data. Instead, the first chip may decode, by using an FEC code type other than the first FEC code type, the second data stream into the first data stream obtained through encoding by using the first FEC code type. In this way, the first data stream is transmitted to the third chip by using a physical medium with interference, and the third chip decodes the first data stream to obtain the original data. The physical medium may be, for example, an optical fiber, an optical waveguide, a circuit, air, or the like.

According to a third aspect, an embodiment provides a data transmission apparatus applied to a first chip. The apparatus includes a receiver, an encoder, and a transmitter. The receiver is configured to receive a first data stream sent by a second chip, where the first data stream is a data stream obtained through encoding by using a first FEC code type. The encoder is configured to encode the first data stream at least once, to obtain a second data stream, where the second data stream is a concatenated FEC code stream obtained through encoding by using at least the first FEC code type and a second FEC code type. The transmitter is configured to send the second data stream to a third chip.

With reference to any implementation of the third aspect, in a first possible implementation of the third aspect, the first FEC code type is specifically: an RS code, a BCH code, a staircase code, an LDPC code, a Turbo code, or a TPC.

With reference to any implementation of the third aspect, in a second possible implementation of the third aspect, the second FEC code type is specifically: a BCH code, an RS code, a staircase code, an LDPC code, a Turbo code, or a TPC.

With reference to any implementation of the third aspect, in a third possible implementation of the third aspect, the encoder is further configured to: distribute the first data stream, to form n third data streams, where data of a same codeword block in the first data stream is distributed to different third data streams; and encode each of the plurality of third data streams at least once, to form the second data stream.

With reference to the third implementation of the third aspect, in a fourth possible implementation of the third aspect, k codeword blocks identified from the first data stream are distributed to the n third data streams, and data that belongs to the k codeword blocks in each of the third data streams is encoded into one codeword block in the second data stream; and a total data volume included in the k codeword blocks in the first data stream is equal to a payload data volume included in n codeword blocks in the second data stream.

With reference to the third implementation of the third aspect, in a fifth possible implementation of the third aspect, data in the first data stream is distributed by FEC symbol block, and data in a same FEC symbol block in the first data stream is encoded into a same codeword block in the second data stream.

With reference to the third implementation of the third aspect, in a sixth possible implementation of the third aspect, data in the first data stream is distributed by bit stream, and data in the third data stream is encoded by bit stream.

With reference to any implementation of the third aspect, in a seventh possible implementation of the third aspect, the first chip and the second chip are located in a first data transmission device, the third chip is located in a second data transmission device, the first chip is an electrical chip, the second chip is a component that uses an Ethernet interface, and the third chip is an electrical chip.

With reference to any possible implementation of the third aspect, in an eighth possible implementation of the third aspect, the first data stream is transmitted between the second chip and the first chip by using a physical medium. It can be learned that, for the first data stream in which an error occurs when the first data stream is transmitted by using a physical medium with interference, the first chip may directly encode the first data stream at least once without performing decoding and error correction on the first data stream, to form the concatenated second data stream.

It may be understood that the data transmission apparatus provided in the third aspect corresponds to the data transmission method provided in the first aspect. Therefore, for technical effects of various possible implementations of the data transmission apparatus provided in the second aspect, refer to the description of the data transmission method provided in the first aspect.

According to a fourth aspect, an embodiment provides a data transmission apparatus applied to a first chip. The apparatus includes a receiver, a decoder, and a transmitter. The receiver is configured to receive a second data stream sent by a second chip, where the second data stream is a concatenated FEC code stream obtained through encoding by using at least a first FEC code type and a second FEC code type. The decoder is configured to decode the second data stream at least once, to form a first data stream, where the first data stream is a data stream obtained through encoding by using the first FEC code type. The transmitter is configured to send the first data stream to a third chip.

With reference to any possible implementation of the fourth aspect, in a first possible implementation of the fourth aspect, the first FEC code type is specifically: an RS code, a BCH code, a staircase code, an LDPC code, a Turbo code, or a TPC.

With reference to any possible implementation of the fourth aspect, in a second possible implementation of the fourth aspect, the second FEC code type is specifically: a BCH code, an RS code, a staircase code, an LDPC code, a Turbo code, or a TPC.

With reference to any possible implementation of the fourth aspect, in a third possible implementation of the fourth aspect, the first data stream is used to be decoded by the third chip based on the first FEC code type.

With reference to any possible implementation of the fourth aspect, in a fourth possible implementation of the fourth aspect, the second chip is located in a first data transmission device, the first chip and the third chip are located in a second data transmission device, the first chip is an electrical chip, the second chip is a chip, and the third chip is a component that uses an Ethernet interface.

With reference to any possible implementation of the fourth aspect, in a fifth possible implementation of the fourth aspect, the first data stream is transmitted between the first chip and the third chip by using a physical medium. It can be learned that the first chip does not decode the second data stream into original data. Instead, the first chip may decode, by using an FEC code type other than the first FEC code type, the second data stream into the first data stream obtained through encoding by using the first FEC code type. In this way, the first data stream is transmitted to the third chip by using a physical medium with interference, and the third chip decodes the first data stream to obtain the original data.

It may be understood that the data transmission apparatus provided in the fourth aspect corresponds to the data transmission method provided in the second aspect. Therefore, for technical effects of various possible implementations of the data transmission apparatus provided in the fourth aspect, refer to the description of the data transmission method provided in the second aspect.

According to a fifth aspect, an embodiment further provides a communication method. The communication method includes the data transmission method according to any implementation of the first aspect and the data transmission method according to any implementation of the second aspect.

According to a sixth aspect, an embodiment further provides a communications system. The communications system includes the data transmission apparatus according to any implementation of the third aspect and the data transmission apparatus according to any implementation of the fourth aspect.

According to a seventh aspect, an embodiment further provides a network device. The network device includes the data transmission apparatus according to any implementation of the third aspect.

According to an eighth aspect, an embodiment further provides a network device. The network device includes the data transmission apparatus according to any implementation of the fourth aspect.

According to a ninth aspect, an embodiment further provides a computer program product. When the computer program product is run on a computer, the computer is enabled to perform the data transmission method according to any implementation of the first aspect or the data transmission method according to any implementation of the second aspect.

According to a tenth aspect, an embodiment further provides a computer-readable storage medium. The computer-readable storage medium stores instructions. When the instructions are run on a computer or a processor, the computer or the processor is enabled to perform the data transmission method according to any possible implementation of the first aspect or the data transmission method according to any possible implementation of the second aspect.

BRIEF DESCRIPTION OF THE DRAWINGS

To describe technical solutions in the embodiments more clearly, the following briefly describes the accompanying drawings for describing the embodiments. It is clear that the accompanying drawings in the following description show merely some embodiments, and a person of ordinary skill in the art may derive other drawings from these accompanying drawings.

DETAILED DESCRIPTION

Figure 1:
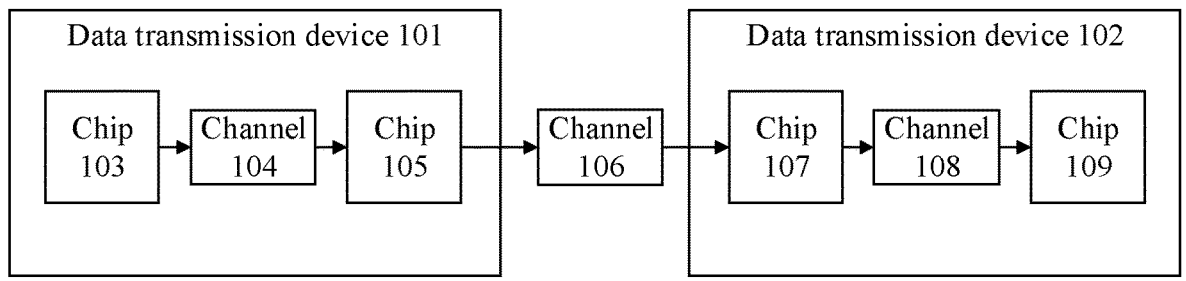
FIG. 1 is a schematic diagram of an example of a scenario according to an embodiment.

In a data transmission process in which an FEC code is used, a sending device may encode original data by using a specific FEC code type, and then send an FEC code obtained through encoding to a receiving device. The receiving device may decode the received FEC code by using the same FEC code type, to obtain the original data. In this way, even if an error occurs at some locations in the FEC code on a transmission lane, the receiving device may obtain the original data that exists before the error occurs by performing reverse calculation based on a parity bit in the FEC code during decoding. This implements an error correction function.

In some scenarios, the FEC code type may need to be converted in the data transmission process. For example, as an enhanced FEC code type, a concatenated FEC code is a multi-level FEC code obtained by performing code type construction on one or more basic FEC code types. This can provide stronger error correction protection for transmitted data. Therefore, the concatenated FEC code may be used to transmit data between devices, to cope with noise introduced when the data is transmitted at a high rate or over a long distance. However, an original FEC code type used by an original data transmission interface of a device is a code type specified in a standard. For example, original Ethernet interfaces of many devices support only a Reed-Solomon (RS) code. When the device is applied to a data transmission scenario with a higher rate or a longer distance than that specified in the standard, the FEC code type specified in the standard cannot meet a requirement. Therefore, the device needs to convert to-be-transmitted data from the original FEC code type to a higher-gain FEC code. Generally, when the FEC code type is converted, data encoded by using the original FEC code type needs to be decoded into original data, and then the original data is encoded by using a new FEC code type. However, such a conversion process not only causes additional power consumption to a data transmission device, but also increases a delay in the data transmission process.

To resolve the foregoing problem, in the embodiments, a concatenated FEC code is an FEC code type that can provide a high gain for high-rate and/or long-distance data transmission, and the concatenated FEC code is obtained by concatenating a plurality of levels of FEC code types. Therefore, in data transmission between two chips, when a chip receives a first data stream obtained through encoding by using a first FEC code type, the chip does not need to first decode the first data stream by using the first FEC code type and then encode original data into a concatenated FEC code. Instead, the chip may encode the first data stream at least once by using at least a second FEC code type, to obtain a second data stream formed by concatenating at least the first FEC code type and the second FEC code type, so as to obtain a higher gain. Therefore, an FEC code type conversion process is simplified, both a delay and device power consumption that are required during FEC code type conversion are reduced, and data transmission efficiency is improved.

For example, the embodiments may be applied to a scenario shown in FIG. 1. A chip 103 and a chip 105 are disposed in a data transmission device 101, and a chip 107 and a chip 109 are disposed in a data transmission device 102. It is assumed that both the chip 103 and the chip 109 support a first FEC code type, but a lane 106 between the data transmission device 101 and the data transmission device 102 needs to use a concatenated FEC code for data transmission. In this case, the chip 103 may encode original data by using the first FEC code type, to form a first data stream; and send the first data stream to the chip 105 through a lane 104. After receiving the first data stream, the chip 105 may encode the first data stream at least once by using at least a second FEC code type, to obtain a second data stream formed by concatenating at least the first FEC code type and the second FEC code type; and send the second data stream to the chip 107 through the lane 106. After receiving the second data stream, the chip 107 may decode the second data stream at least once by using the second FEC code type, to obtain the first data stream obtained through encoding by using the first FEC code type; and send the first data stream to the chip 109 through a lane 108. After receiving the first data stream, the chip 109 may decode the first data stream by using the first FEC code type, to obtain the original data. The first FEC code type may be an FEC code type such as an RS code supported by an Ethernet interface, and the second FEC code type may be a code type such as a Bose-Chaudhuri-Hocquenghem (BCH) code. It should be noted that the lane 104, the lane 106, and the lane 108 may be all physical links with interference, and an error occurs when a data stream is transmitted on each of the lane 104, the lane 106, and the lane 108. In other words, an error occurs when the first data stream sent by the chip 103 to the chip 105 is transmitted on the lane 104, an error occurs when the second data stream sent by the chip 105 to the chip 107 is transmitted on the lane 106, and an error occurs when the first data stream sent by the chip 107 to the chip 109 is transmitted on the lane 108.

A "physical medium" and a "physical link" are often interchangeable. A person skilled in the art may understand that the "physical medium" and the "physical link" indicate a same meaning.

It may be understood that the foregoing scenario is merely a scenario example provided in the embodiments, and the embodiments are not limited to this scenario.

With reference to the accompanying drawings, the following uses embodiments to describe in detail specific implementations of a data transmission method and apparatus in the embodiments.

Figure 2:
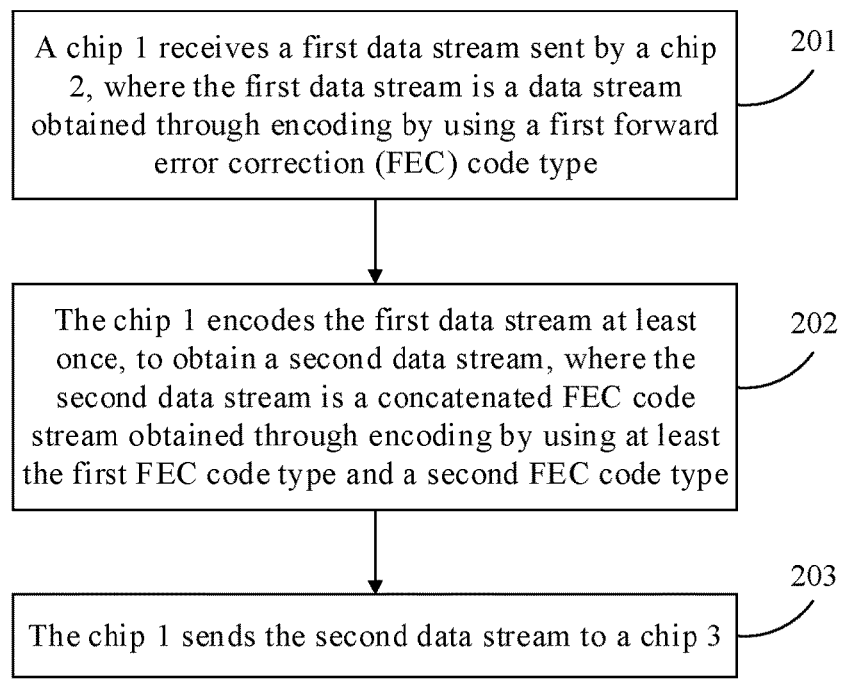
FIG. 2 is a schematic flowchart of a data transmission method according to an embodiment.

FIG. 2 is a schematic flowchart of a data transmission method 200 according to an embodiment. For example, the method may include the following steps.

201: A chip 1 receives a first data stream sent by a chip 2, where the first data stream is a data stream obtained through encoding by using a first FEC code type.

In specific implementation, the chip 2 may encode original data by using the first FEC code type, to form the first data stream, and send the first data stream to the chip 1. Therefore, the first data stream received by the chip 1 is a data stream obtained through encoding by using the first FEC code type. In other words, the first data stream is a code stream including codeword blocks of the first FEC code type.

The first FEC code type may be a code type such as an RS code, a BCH code, a staircase code, a low-density parity check (LDPC) code, a turbo code, or a TPC. For example, in an example scenario, assuming that the chip 2 communicates with the chip 1 through an Ethernet interface, the first FEC code type may be an RS code.

It may be understood that the codeword block of the first FEC code type includes an additional parity code provided for the original data, and the parity code is used to correct an error that occurs in a data transmission process. For example, the first FEC code type may be a systematic FEC code, that is, the codeword block of the first FEC code type may include the original data and the parity code provided for the original data.

The codeword block of the first FEC code type may be processed based on a finite field. The codeword block may be divided into a plurality of FEC symbol blocks, and processing on the codeword block may be performed at an FEC symbol block granularity. For example, in an RS code, a 5440-bit codeword block includes 5140-bit original data and a 300-bit parity code. If a Galois field (GF) (210) is used for processing, and every 10 bits of data constitute one FEC symbol block, one codeword block includes 544 FEC symbol blocks, to be specific, original data including 514 FEC symbol blocks and a parity code including 30 FEC symbol blocks. For another example, in another RS code, a 5280-bit codeword block includes 5140-bit original data and a 140-bit parity code. If a GF (210) field is used for processing, and every 10 bits of data constitute one FEC symbol block, one codeword block includes 528 FEC symbol blocks, to be specific, original data including 514 FEC symbol blocks and a parity code including 14 FEC symbol blocks. It may be understood that, for consecutive errors, also referred to as burst errors, consecutive errors are equivalent to errors of only a small quantity of FEC symbol blocks. Therefore, processing an FEC codeword block at an FEC symbol block granularity provides a stronger FEC error correction capability.

It may be understood that the chip 1 and the chip 2 are two different chips, and data may be transmitted between the chip 1 and the chip 2 through a physical link with interference. Therefore, an error occurs in the first data stream due to the interference when the first data stream sent by the chip 2 to the chip 1 is transmitted on the physical link. It can be learned that the first data stream received by the chip 1 is a data stream in which an error has occurred.

202: The chip 1 encodes the first data stream at least once, to obtain a second data stream, where the second data stream is a concatenated FEC code stream obtained through encoding by using at least the first FEC code type and a second FEC code type.

In specific implementation, for the first data stream that is obtained through encoding by using the first FEC code type, the chip 1 does not need to first decode the first data stream by using the first FEC code type into original data. Instead, the chip 1 may encode the first data stream at least once by using at least the second FEC code type, so as to form the second data stream by concatenating at least the first FEC code type and the second FEC code type. In other words, the second data stream may be a concatenated FEC code stream that is obtained by concatenating the first FEC code type and the second FEC code type, that is, the second data stream is a two-level concatenated FEC code stream; or the second data stream may be a data stream that is obtained by concatenating one or more levels of concatenated FEC code streams based on concatenation of the first FEC code type and the second FEC code type, that is, the second data stream is a three-level concatenated FEC code stream or a concatenated FEC code stream with more than three levels. It may be understood that, if the chip 2 sends the first data stream to the chip 1 through the physical link with interference, the first data stream received by the chip 1 is a data stream in which an error has occurred. Therefore, the chip 1 does not decode the first data stream in which an error has occurred. Instead, the chip 1 directly encodes, at least once, the first data stream in which an error has occurred, so as to form the second data stream by concatenating a plurality of levels of FEC coding.

The second FEC code type may be a code type such as a BCH code, an RS code, a staircase code, an LDPC code, a Turbo code, or a TPC. It may be understood that the second FEC code type may be the same as the first FEC code type, or the second FEC code type may be different from the first FEC code type. For example, both the first FEC code type and the second FEC code type may be an RS code; or the first FEC code type may be an RS code, and the second FEC code type may be a BCH code.

It should be noted that the second data stream is a code stream including a codeword block of an FEC code type that is used for last-level coding. For example, if the second data stream is a data stream formed by concatenating the first FEC code type and the second FEC code type, the first FEC code type is used for first-level coding, and the second FEC code type is used for second-level coding, the second data stream is a code stream including a codeword block of the second FEC code type. Because the second data stream is obtained through encoding by using the second FEC code type based on the first data stream, the codeword block of the second FEC code type includes an additional parity code provided for the first data stream. If the second FEC code type is a systematic code, the codeword block of the second FEC code type includes data in the first data stream and a parity code provided for the data.

Figure 3:
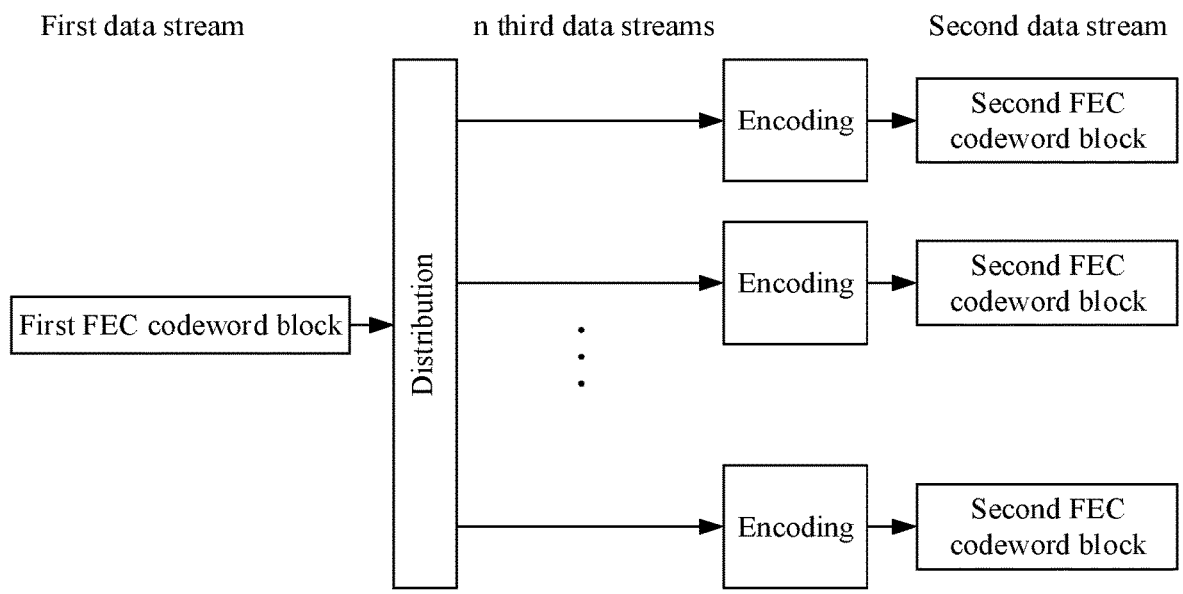
FIG. 3 is a schematic diagram of an example of a data distribution mode according to an embodiment.

In some implementations, to make an error correction capability stronger, data in a same codeword block in the first data stream may be encoded into a plurality of different codeword blocks in the second data stream. In this way, even if a small part of codeword blocks in the second data stream cannot be correctly decoded, correct decoding of the codeword block in the first data stream is not affected. In specific implementation, the chip 1 may distribute the first data stream to n different lanes in a distribution manner, to form n third data streams, so that data in a same codeword block in the first data stream is distributed to a plurality of different third data streams, where n represents a natural number greater than 1. Then, the chip 1 may encode each of the third data streams on the n lanes at least once, to form the second data stream. For example, in an example in FIG. 3, a first FEC codeword block is a codeword block in the first data stream, and data in the codeword block is distributed to one or more third data streams on the n lanes. The third data stream on each lane is encoded into one second FEC codeword block, to form n second FEC code streams; and the n code streams of the second FEC code type form the second data stream. The first FEC codeword block is a codeword block obtained through encoding by using the first FEC code type, the second FEC codeword block is a codeword block obtained through encoding by using the second FEC code type, and the second FEC code stream is a data stream including the second FEC codeword block.

It may be understood that the first data stream may be a data stream on one lane, or may include data streams on a plurality of lanes. In other words, the first data stream may be one code stream, or may include a plurality of code streams.

Figure 4:
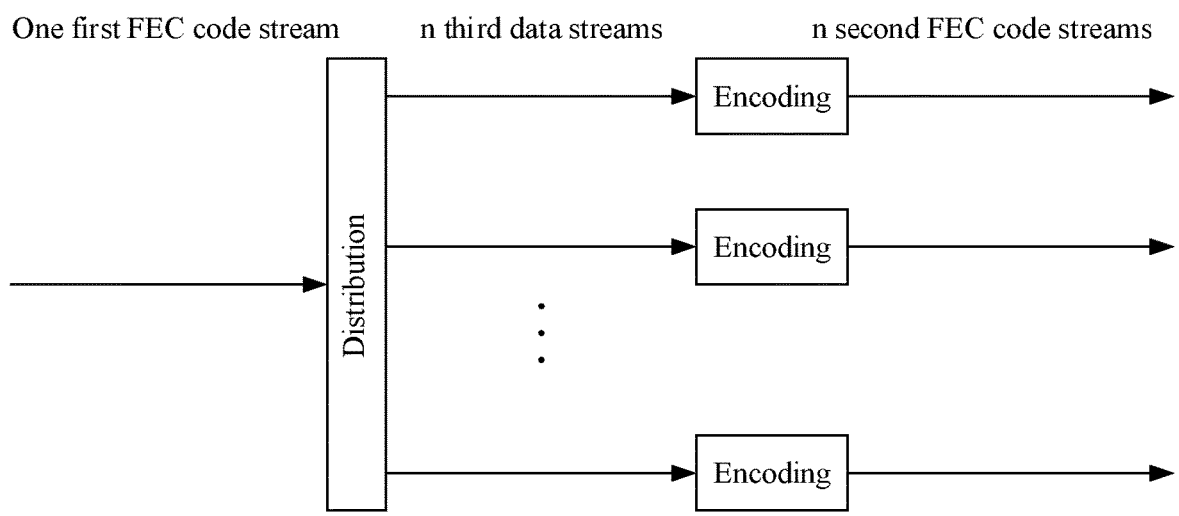
FIG. 4 is a schematic diagram of an example of a data distribution mode according to an embodiment.

If the first data stream is a data stream on one lane, the first data stream is distributed to form third data streams. This is equivalent to that one data stream is distributed to form a plurality of data streams. For example, in an example shown in FIG. 4, it is assumed that n is a natural number greater than 1, the first data stream is a first FEC code stream on one lane, and third data streams on the n lanes are formed after distribution processing. The third data stream on each lane is encoded into one second FEC code stream, and n FEC code streams form the second data stream. The first FEC code stream is a data stream including a first FEC codeword block, and the first FEC codeword block is a codeword block obtained through encoding by using the first FEC code type. The second FEC code stream is a data stream including a second FEC codeword block, and the second FEC codeword block is a codeword block obtained through encoding by using the second FEC code type.

Figure 5:
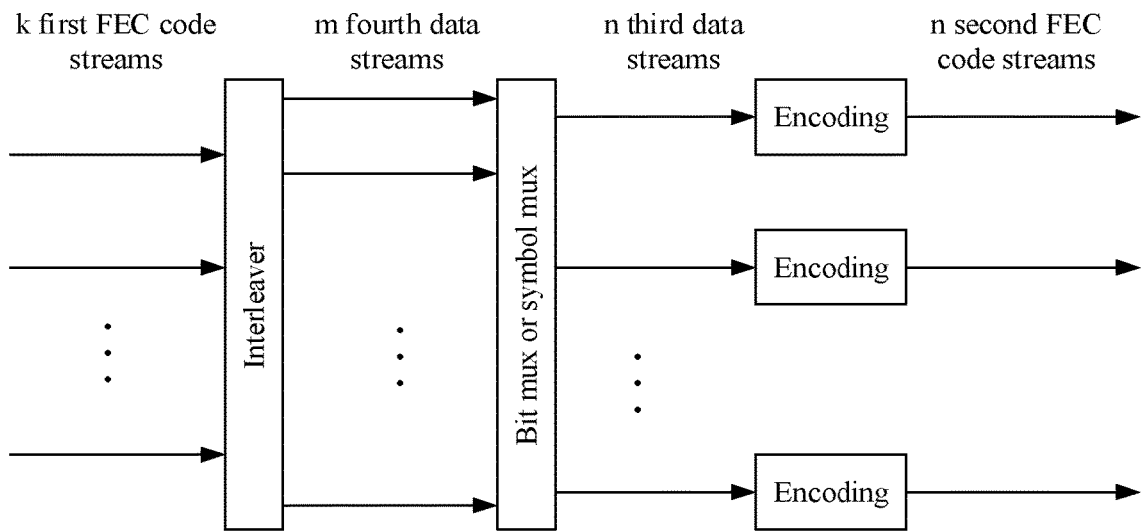
FIG. 5 is a schematic diagram of an example of a data distribution mode according to an embodiment.

If the first data stream includes data streams on a plurality of lanes, that the first data stream is distributed to form the third data stream is equivalent to that a plurality of data streams are distributed to form a plurality of data streams, and such distribution may be implemented according to a distribution policy such as an interleaving technology and/or a multiplexing technology. For example, in an example shown in FIG. 5, it is assumed that k, m, and n are all natural numbers greater than 1, the first data stream includes first FEC code streams on k lanes, the first data stream may be interleaved by an interleaver to form fourth data streams on m lanes, and then the fourth data streams on the m lanes may be multiplexed by a multiplexer such as a bit multiplexer or a symbol multiplexer, to form third data streams on the n lanes. The third data stream on each lane is then encoded into one second FEC code stream, and n FEC code streams form the second data stream. The first FEC code stream is a data stream including a first FEC codeword block, and the first FEC codeword block is a codeword block obtained through encoding by using the first FEC code type. The second FEC code stream is a data stream including a second FEC codeword block, and the second FEC codeword block is a codeword block obtained through encoding by using the second FEC code type.

It should be noted that a plurality of distribution manners may be used to distribute the first data stream to form the n third data streams.

In an example, the chip 1 may perform distribution processing on the first data stream at a bit granularity, that is, data in the first data stream may be distributed to the n third data streams by bit stream. During specific implementation, the chip 1 may obtain one-bit data from the first data stream, and select a lane for the data from the n lanes according to a distribution policy, so as to distribute the data to a third data stream on the lane. Correspondingly, the chip 1 may also perform encoding processing on the third data stream at a bit granularity, that is, data in the third data stream may be encoded by bit stream.

In another example, the chip 1 may perform distribution processing on the first data stream at an FEC symbol block granularity, that is, data in the first data stream may be distributed by FEC symbol block. During specific implementation, the chip 1 may identify an FEC symbol block from the first data stream, and select a lane for the FEC symbol block from the n lanes according to a distribution policy, so as to distribute the FEC symbol block to a third data stream on the lane. Correspondingly, the chip 1 may also encode the third data stream at an FEC symbol block granularity. During specific implementation, the chip 1 may identify a specific quantity of FEC symbol blocks from the third data stream and encode the FEC symbol blocks into a same codeword block in the second data stream. Therefore, data in a same FEC symbol block in the first data stream is encoded into a same codeword block in the second data stream. The FEC symbol block may be identified by using an alignment marker (AM).

In still another example, the chip 1 may perform distribution processing on the first data stream at a granularity of a plurality of codeword blocks. During specific implementation, the chip 1 may identify a plurality of codeword blocks from the first data stream, and distribute the plurality of codeword blocks to third data streams on the n lanes according to a distribution policy. The distribution policy may be implemented, for example, by using an interleaving technology and/or a multiplexing technology. In addition, the first data stream may be one code stream, that is, the plurality of codeword blocks may be identified from one code stream; or the first data stream may include a plurality of code streams, that is, the k codeword blocks may be identified from a plurality of code streams, for example, the first data stream includes k code streams, and the plurality of codeword blocks may be k codeword blocks obtained by identifying one codeword block from each code stream.

Figure 6:
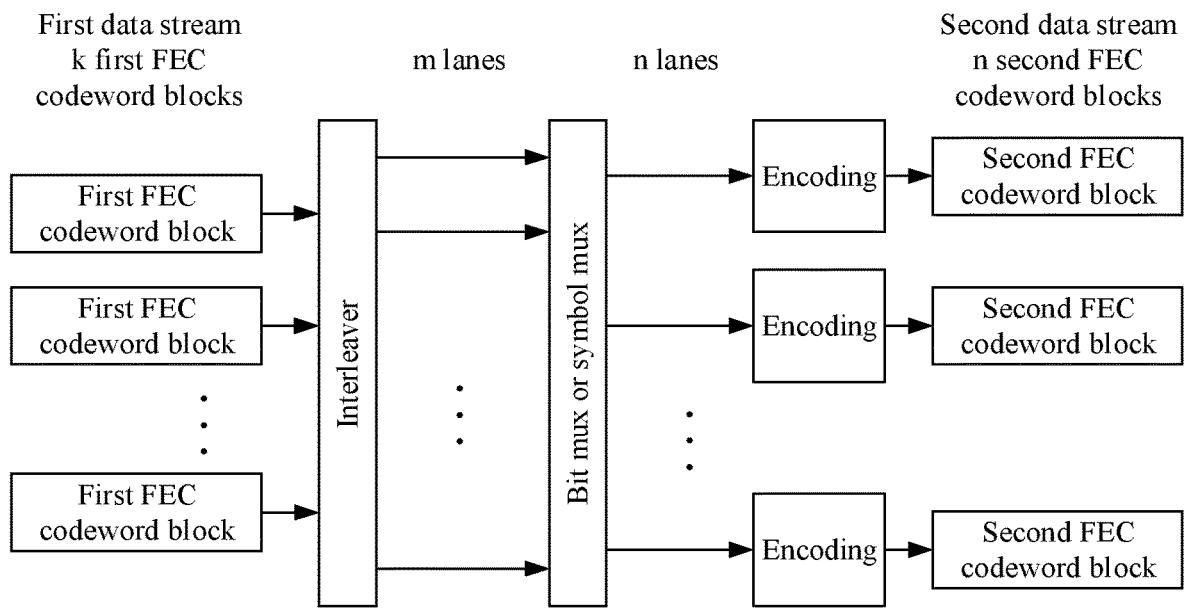
FIG. 6 is a schematic diagram of an example of a data distribution mode according to an embodiment.

To facilitate decoding of the second data stream into original data on a same chip, the chip 1 may use all data of the k codeword blocks in the first data stream as payloads of n codeword blocks in the second data stream, so that the k codeword blocks in the first data stream are encoded into the n codeword blocks in the second data stream. During specific implementation, the chip 1 may identify the k codeword blocks from the first data stream, and distribute the k codeword blocks to one or more third data streams on the n lanes according to a distribution policy. Data of the k codeword blocks that is distributed to each lane may be encoded into one codeword block in the second data stream, so as to obtain the n codeword blocks in the second data stream through encoding on the n lanes. For example, in the example shown in FIG. 6, it is assumed that k, m, and n are all natural numbers greater than 1, and k first FEC codeword blocks identified from the first data stream are input into an interleaver. Data output by the interleaver to the m lanes is then input into a multiplexer such as a bit multiplexer or a symbol multiplexer, and the multiplexer outputs data on the n lanes. Data on each lane is then encoded into one second FEC codeword block, so that n second FEC codeword blocks in the second data stream are obtained. The first FEC codeword block is a codeword block obtained through encoding by using the first FEC code type, and may be identified from the first data stream by using the AM. The second FEC codeword block is a codeword block obtained through encoding by using the second FEC code type.

To enable the k codeword blocks in the first data stream to be encoded into the n codeword blocks in the second data stream, a total data volume included in the k codeword blocks in the first data stream needs to be equal to a payload data volume included in the n codeword blocks in the second data stream. For example, it is assumed that the first data stream is an RS code stream and the second data stream is a BCH code stream, an RS codeword block of the first data stream includes a 5140-bit payload and a 300-bit parity code, and a BCH codeword block of the second data stream includes a 340-bit payload and a 20-bit parity code. It can be learned that a total data volume of four RS codeword blocks is 21760 bits, and a payload data volume of 64 BCH codeword blocks is also 21760 bits. Therefore, the four RS codeword blocks of the first data stream may be encoded into the 64 BCH codeword blocks of the second data stream.

203: The chip 1 sends the second data stream to a chip 3.

After receiving the second data stream, the chip 3 may decode the second data stream. In this way, data is transmitted between the chip 1 and the chip 3 by using a concatenated FEC code.

In an example, the chip 3 may decode all FEC code types including the first FEC code type and the second FEC code type in the second data stream, to obtain the original data. In another example, the chip 3 may decode an FEC code type other than the first FEC code type in the second data stream, to obtain the first data stream, and send the first data stream to a chip 4. Then, the chip 4 decodes the first FEC code type in the first data stream, to obtain the original data. It may be understood that the chip 1 and the chip 3 are two different chips, and data may be transmitted between the chip 1 and the chip 3 through a physical link with interference. Similarly, the chip 3 and the chip 4 are two different chips, and data may be transmitted between the chip 3 and the chip 4 through a physical link. Therefore, an error occurs in the second data stream due to the interference of the physical link when the second data stream sent by the chip 1 to the chip 3 is transmitted on the physical link. The chip 3 does not decode or correct the second data stream in which an error has occurred into the original data. Instead, the chip 3 decodes the second data stream that is obtained by concatenating FEC codes into the first data stream that is obtained through encoding by using the first FEC code type; and sends the first data stream to the chip 4. When the first data stream sent by the chip 3 to the chip 4 is transmitted on the physical link, an error occurs again due to the interference. In this case, the chip 4 decodes and corrects the first data stream into the original data. It can be learned that the first data stream received by the chip 1 is a data stream in which an error has occurred.

For the concatenated FEC codes in the second data stream, decoding of each level of FEC code type may be implemented by identifying a codeword block of the level of FEC code type and performing reverse calculation on the identified codeword block. For example, if the second data stream is formed by concatenating the first FEC code type and the second FEC code type, when the second data stream is decoded, a codeword block of the second FEC code type may be identified from the second data stream in a manner such as the AM, a self-synchronization technology, or the like, and reverse calculation is performed on the codeword block of the second FEC code type, to obtain the first data stream; and then a codeword block of the first FEC code type may be identified from the first data stream in a manner such as a fixed mapping relationship between the codeword block of the second FEC code type and the codeword block of the first FEC code type, the AM, or the like, and reverse calculation is performed on the codeword block of the first FEC code type, to obtain the original data.

Figure 7:
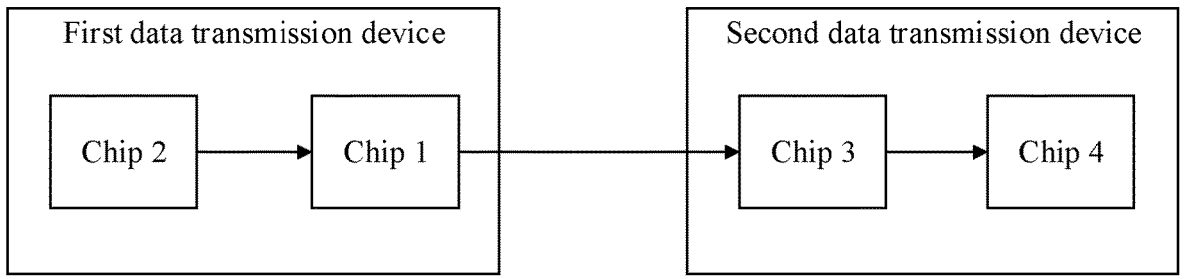
FIG. 7 is a schematic diagram of a network structure in an example scenario according to an embodiment.

In an example scenario, as shown in FIG. 7, the chip 1 and the chip 2 may be two chips located in a first data transmission device, and the chip 3 and the chip 4 may be two chips located in a second data transmission device. Data needs to be transmitted between the first data transmission device and the second data transmission device by using a concatenated FEC code, but the chip 2 and the chip 4 support only the first FEC code type but do not support the concatenated FEC code. Therefore, the chip 1 encodes a data stream output by the chip 2 to form a concatenated FEC code stream, and sends the concatenated FEC code stream to the chip 3. The chip 3 decodes the concatenated FEC code stream into a data stream that is based on the first FEC code type, and then outputs the data stream that is based on the first FEC code type to the chip 4. In this way, data can be transmitted between the chip 1 and the chip 3 by using the concatenated FEC code, so that data transmission is implemented between the first data transmission device and the second data transmission device by using the concatenated FEC code. The chip 1 may be an electrical chip, for example, may be a relay electrical chip or an electrical chip of an optical module, for example, a digital signal processing (DSP) chip. The chip 2 may be a chip that uses an Ethernet interface, for example, a physical layer (PHY) chip. The chip 3 may be an electrical chip, for example, may be a relay electrical chip or an electrical chip of an optical module, for example, a DSP chip. The chip 4 may be a chip that uses an Ethernet interface, for example, a PHY chip.

It should be noted that the concatenated FEC code provided in this embodiment achieves a relatively good error correction effect in simulation verification. It is assumed that simulation verification is performed in the example scenario shown in FIG. 7. Additive white Gaussian noise (AWGN) is inserted into a lane between the chip 2 and the chip 1, a lane between the chip 1 and the chip 3, and a lane between the chip 3 and the chip 4, to form a simulation environment. In the simulation environment, the chip 2 sends a data stream that is based on the first FEC code type to the chip 1; the chip 1 converts the data stream that is based on the first FEC code type into a concatenated FEC code stream, and then sends the concatenated FEC code stream to the chip 3; and the chip 3 converts the concatenated FEC code stream into the data stream that is based on the first FEC code type, and then sends the data stream that is based on the first FEC code type to the chip 4. In this case, the chip 4 can correctly decode the received data stream that is based on the first FEC code type. If the chip 2 sends the data stream that is based on the first FEC code type to the chip 1, the chip 1 directly sends the data stream that is based on the first FEC code type to the chip 3, and the chip 3 directly sends the data stream that is based on the first FEC code type to the chip 4, the chip 4 cannot correctly decode the received data stream that is based on the first FEC code type.

A result of simulation verification performed in the foregoing simulation environment shows that, in comparison with that the chip 1 first decodes the code stream that is based on the first FEC code type and then performs multi-level coding, to form the concatenated FEC code stream, that the chip 1 does not decode the code stream that is based on the first FEC code type, but instead, the chip 1 encodes, by using the second FEC code type, the code stream that is based on the first FEC code type, to form the concatenated FEC code stream can reduce a delay of 60 to 100 ns, and achieve a net coding gain (NCG) of more than 9 decibels (dB).

In this embodiment, for the first data stream that is obtained through encoding by using the first FEC code type and that is sent by the chip 2 to the chip 1, the chip 1 does not need to first decode the first data stream by using the first FEC code type and then encode original data into a concatenated FEC code. Instead, the chip 1 may encode the first data stream at least once by using at least the second FEC code type, to obtain the second data stream formed by concatenating at least the first FEC code type and the second FEC code type. Therefore, an FEC code type conversion process is simplified, both a delay and device power consumption that are required during FEC code type conversion are reduced, and data transmission efficiency is improved.

Figure 8:
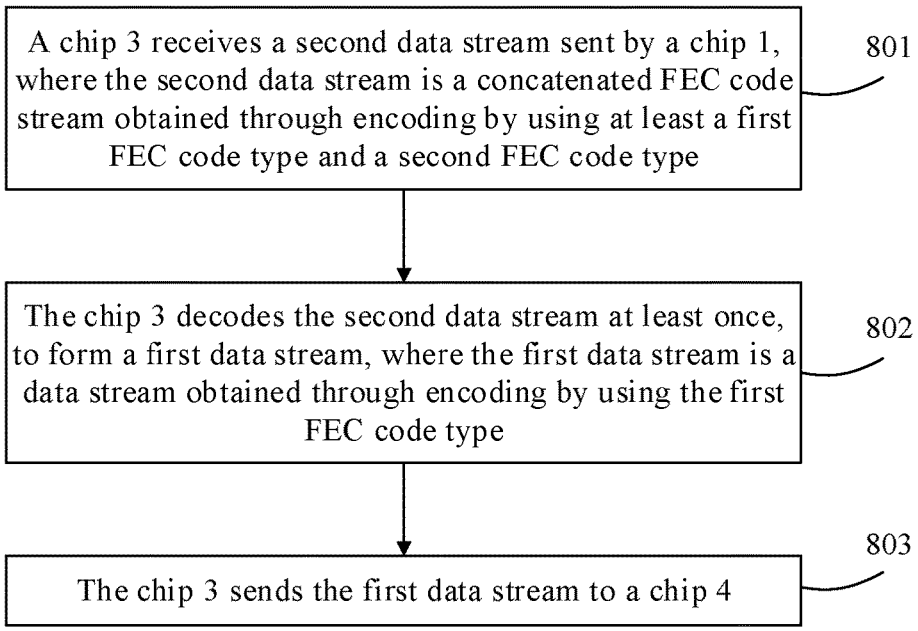
FIG. 8 is a schematic flowchart of a data transmission method according to an embodiment.

FIG. 8 is a schematic flowchart of a data transmission method 800 according to an embodiment. For example, the method may include the following steps.

801: A chip 3 receives a second data stream sent by a chip 1, where the second data stream is a concatenated FEC code stream obtained through encoding by using at least a first FEC code type and a second FEC code type.

802: The chip 3 decodes the second data stream at least once, to form a first data stream, where the first data stream is a data stream obtained through encoding by using the first FEC code type.

803: The chip 3 sends the first data stream to a chip 4.

After receiving the first data stream, the chip 4 may decode the first data stream based on the first FEC code type, to obtain original data.

The first FEC code type may be a code type such as an RS code, a BCH code, a staircase code, an LDPC code, a Turbo code, or a TPC. The second FEC code type may be a code type such as a BCH code, an RS code, a staircase code, an LDPC code, a Turbo code, or a TPC.

In an example scenario, the chip 1 may be located in a first data transmission device, the chip 3 and the chip 4 may be located in a second data transmission device, the chip 3 and the chip 1 may be electrical chips, for example, relay electrical chips or electrical chips of optical modules, and the chip 4 may be a chip that uses an Ethernet interface.

It may be understood that this embodiment corresponds to a process of decoding the second data stream, and the embodiment shown in FIG. 2 corresponds to a process of encoding the second data stream. Therefore, for various specific implementations related to this embodiment, for example, specific implementations of the first data stream, the second data stream, the first FEC code type, the second FEC code type, the chip 1, the chip 3, and the chip 4, refer to the description of the embodiment shown in FIG. 2. That is, the method in the embodiment corresponding to FIG. 8 is a decoding solution reverse to the encoding solution described in the embodiment corresponding to FIG. 2.

In this embodiment, for the second data stream that is formed by concatenating at least the first FEC code type and the second FEC code type and that is sent by the chip 1 to the chip 3, the chip 3 may decode the second data stream by using an FEC code type other than the first FEC code type, to form the first data stream that is obtained through encoding by using the first FEC code type, and send the first data stream to the chip 4. In this way, the chip 3 does not need to decode the second data stream into original data, then encode the original data into a data stream that is based on the first FEC code type, and send the data stream to the chip 4. Therefore, an FEC code type conversion process is simplified, both a delay and device power consumption that are required during FEC code type conversion are reduced, and data transmission efficiency is improved.

Figure 9:
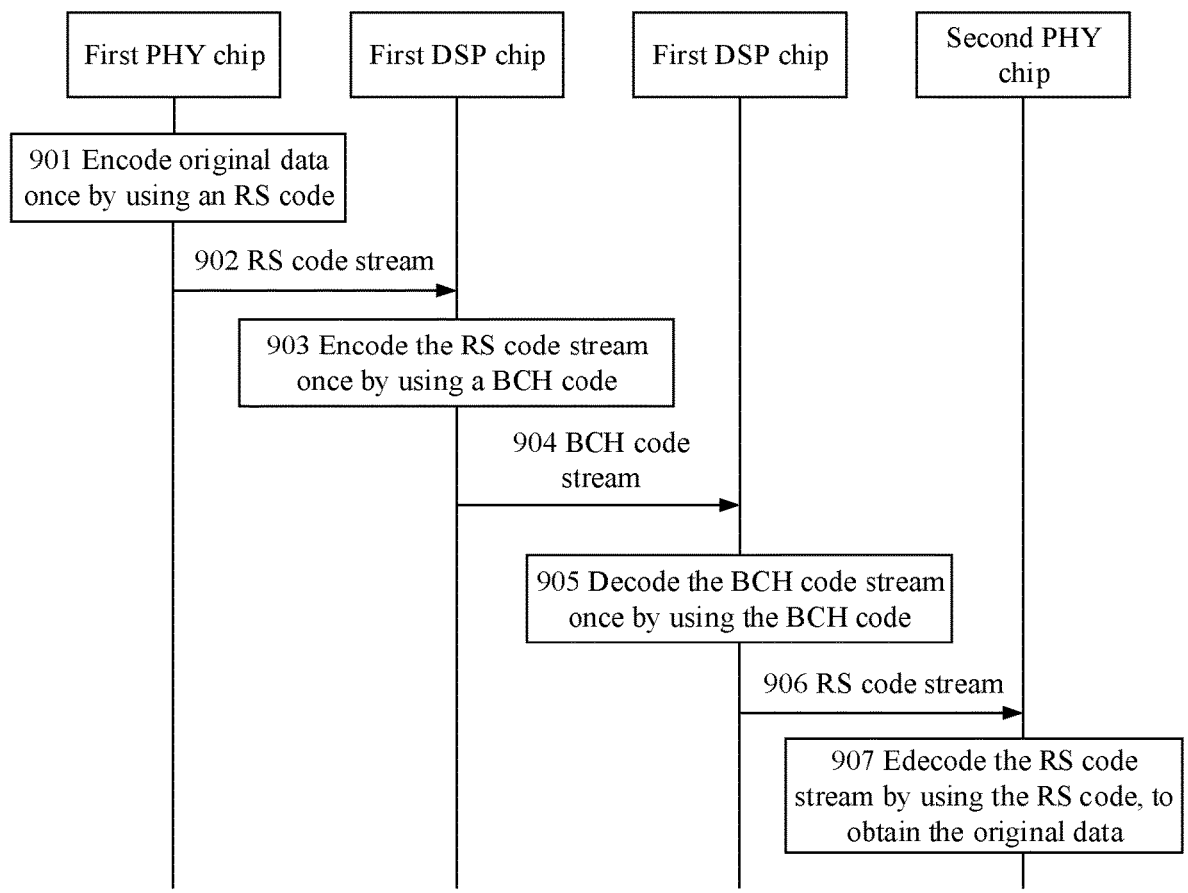
FIG. 9 is a schematic flowchart of a data transmission method according to an embodiment.

The following describes, by using a specific scenario example, an example in which the data transmission method provided in the embodiments is applied to a specific scenario. In this specific scenario example, a first data transmission device includes a first PHY chip and a first optical module, and the first optical module has a first DSP chip; and a second data transmission device includes a second PHY chip and a second optical module, and the second optical module has a second DSP chip. Data is transmitted between the first data transmission device and the second data transmission device by using a concatenated FEC code, and the first PHY chip and the second PHY chip support an RS code but do not support the concatenated FEC code. In this specific scenario, as shown in FIG. 9, a data transmission method 900 between the first data transmission device and the second data transmission device may include, for example, the following steps.

901: The first PHY chip encodes original data once by using an RS code, to form an RS code stream.

902: The first PHY chip sends the RS code stream to the first DSP chip.

903: The first DSP chip encodes the RS code stream once by using a BCH code, to form a BCH code stream.

The BCH code stream is actually a concatenated FEC code stream formed by concatenating the RS code and the BCH code.

904: The first DSP chip sends the BCH code stream to the second DSP chip.

905: The second DSP chip decodes the BCH code stream once by using the BCH code, to form the RS code stream.

906: The second DSP chip sends the RS code stream to the second PHY chip.

907: The second PHY chip decodes the RS code stream by using the RS code, to obtain the original data.

In this embodiment, the first DSP chip does not need to first decode the RS code stream by using the RS code and then encode the original data into the concatenated FEC code stream. Instead, the first DSP chip may encode the RS code stream at least once by using the BCH code, to form the concatenated FEC code stream obtained by concatenating the RS code and the BCH code. In this way, data can be transmitted between the first DSP chip and the second DSP chip by using the concatenated FEC code stream. In addition, the second DSP chip does not need to decode the concatenated FEC code stream into the original data and then the original data into the RS code stream. Instead, the second DSP chip may decode the concatenated FEC code stream once by using the BCH code, to form the RS code stream. In this way, the second PHY chip can receive the RS code stream. Therefore, an FEC code type conversion process is simplified, both a delay and device power consumption that are required during FEC code type conversion are reduced, and data transmission efficiency is improved.

Figure 10:
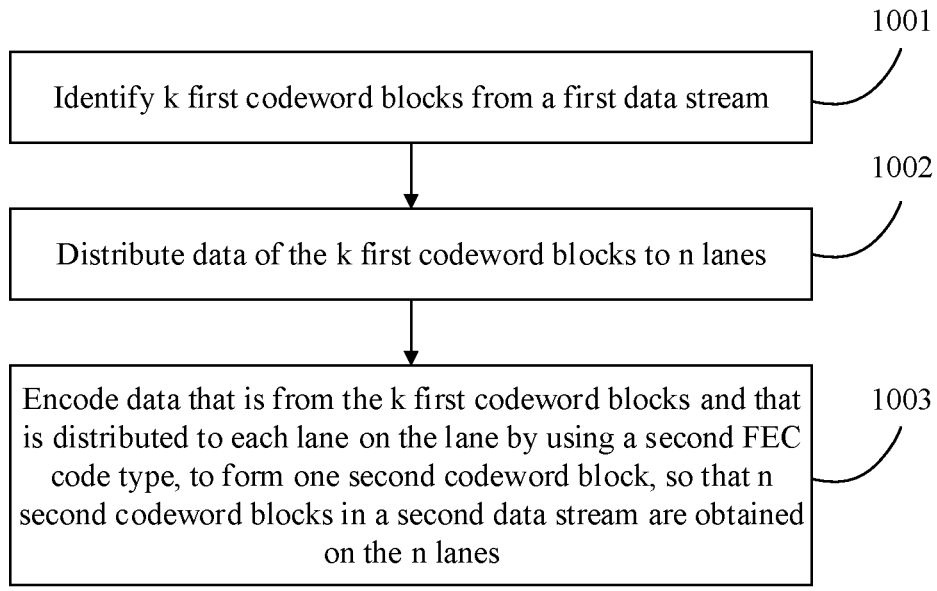
FIG. 10 is a schematic flowchart of an encoding method according to an embodiment.

FIG. 10 is a schematic flowchart of an encoding method 1000 according to an embodiment. The method 1000 is used to encode k codeword blocks of a first FEC code type by using a second FEC code type, to form n codeword blocks of the second FEC code type. Specifically, the method 1000 may include the following steps.

1001: Identify k first codeword blocks from a first data stream.

The first data stream is a data stream obtained through encoding by using the first FEC code type. Therefore, the first codeword block in the first data stream is a codeword block of the first FEC code type. The first codeword block may be identified from the first data stream by using an AM.

1002: Distribute data of the k first codeword blocks to n lanes.

A distribution policy may be implemented by using an interleaving technology and/or a multiplexing technology. For example, k first FEC codeword blocks may be input into an interleaver, data output by the interleaver to m lanes is then input into a multiplexer such as a bit multiplexer or a symbol multiplexer, and the multiplexer outputs data on the n lanes.

1003: Encode data that is from the k first codeword blocks and that is distributed to each lane on the lane by using the second FEC code type, to form one second codeword block, so that n second codeword blocks in a second data stream are obtained on the n lanes.

On each lane, the data from the k first codeword blocks is encoded into one second codeword block as a payload, that is, the payload of the second codeword block is the data that is from the k first codeword blocks and that is distributed to the lane. Therefore, all payloads of the n second codeword blocks that are obtained through encoding on the n lanes are all data of the k first codeword blocks, that is, a total data volume of the k first codeword blocks needs to be equal to a payload data volume of the n second codeword blocks.

In this embodiment, because payloads in the n second codeword blocks are all data in the k codeword blocks, the n second codeword blocks may be directly decoded into original data based on the second FEC code type and the first FEC code type. This helps perform decoding operations on a same chip based on the first FEC code type and the second FEC code type.

Figure 11:
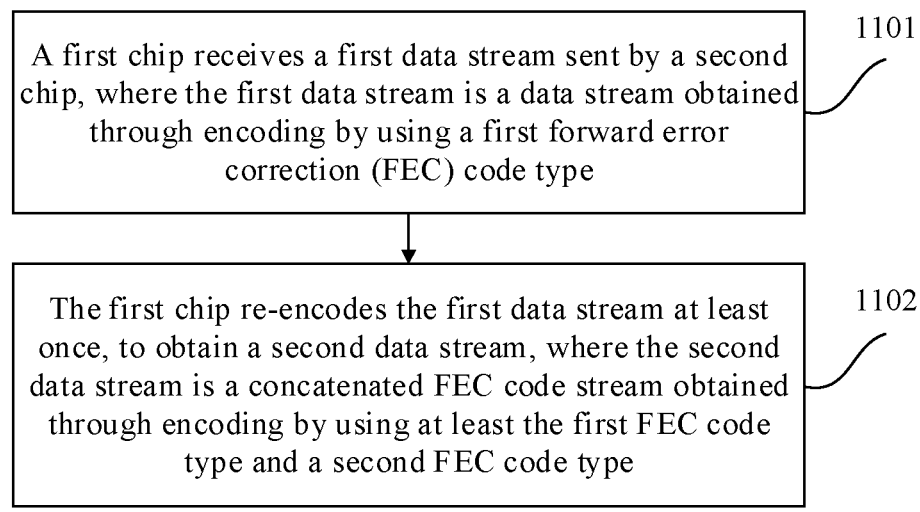
FIG. 11 is a schematic flowchart of a data transmission method according to an embodiment.

FIG. 11 is a schematic diagram of a structure of a data transmission method 1100 according to an embodiment. The method 1100 includes the following steps.

1101: A first chip receives a first data stream sent by a second chip, where the first data stream is a data stream obtained through encoding by using a first FEC code type.

1102: The first chip encodes the first data stream at least once, to obtain a second data stream, where the second data stream is a concatenated FEC code stream obtained through encoding by using at least the first FEC code type and a second FEC code type.

In some possible implementations, the first FEC code type is specifically: an RS code, a BCH code, a staircase code, an LDPC code, a Turbo code, or a TPC.

In some possible implementations, the second FEC code type is specifically: a BCH code, an RS code, a staircase code, an LDPC code, a Turbo code, or a TPC.

In some possible implementations, that the first chip encodes the first data stream at least once, to form a second data stream includes: the first chip distributes the first data stream, to form n third data streams, where data of a same codeword block in the first data stream is distributed to different third data streams; and the first chip encodes each of the plurality of third data streams at least once, to form the second data stream.

In some possible implementations, k codeword blocks identified from the first data stream are distributed to the n third data streams, and data that belongs to the k codeword blocks in each of the third data streams is encoded into one codeword block in the second data stream; and a total data volume included in the k codeword blocks in the first data stream is equal to a payload data volume included in n codeword blocks in the second data stream.

In some possible implementations, data in the first data stream is distributed by FEC symbol block, and data in a same FEC symbol block in the first data stream is encoded into a same codeword block in the second data stream.

In some possible implementations, data in the first data stream is distributed by bit stream, and data in the third data stream is encoded by bit stream.

In some possible implementations, the first chip and the second chip are located in a same data transmission device, the first chip is an electrical chip, and the second chip is a chip that uses an Ethernet interface.

It may be understood that the first chip is the chip 1 mentioned in the data transmission method 200, the second chip is the chip 2 mentioned in the data transmission method 200, and a third chip is the chip 3 mentioned in the data transmission method. Therefore, for various specific implementations of operations performed by the first chip, the second chip, and the third chip in this embodiment, refer to the descriptions of the chip 1, the chip 2, and the chip 3 in the data transmission method 200 shown in FIG. 2. Details are not described again in this embodiment.

In this embodiment, for the first data stream that is obtained through encoding by using the first FEC code type and that is sent by the chip 2 to the chip 1, the chip 1 does not need to first decode the first data stream by using the first FEC code type and then encode original data into a concatenated FEC code. Instead, the chip 1 may encode the first data stream at least once by using at least the second FEC code type, to obtain the second data stream formed by concatenating at least the first FEC code type and the second FEC code type. Therefore, an FEC code type conversion process is simplified, both a delay and device power consumption that are required during FEC code type conversion are reduced, and data transmission efficiency is improved.

Figure 12:
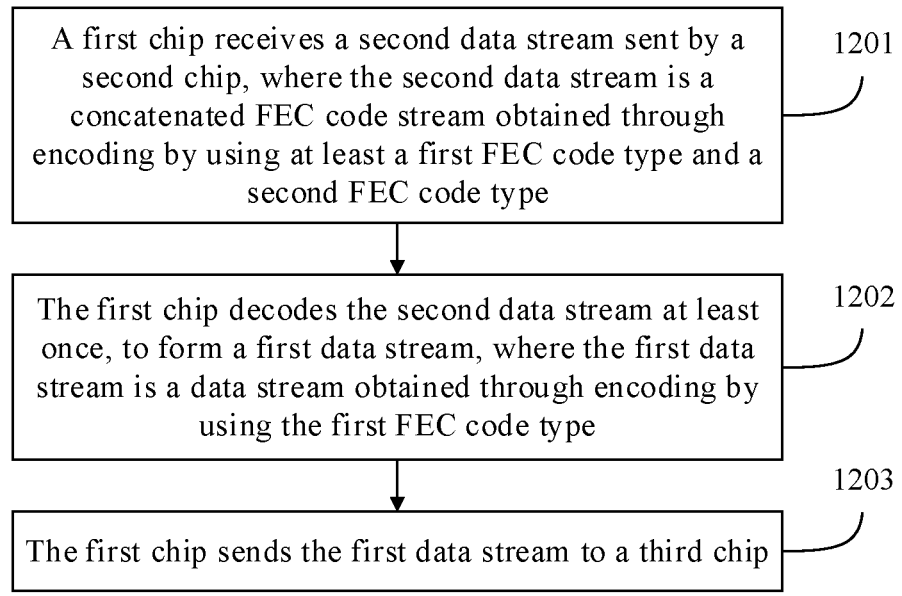
FIG. 12 is a schematic flowchart of a data transmission method according to an embodiment.

FIG. 12 is a schematic diagram of a structure of a data transmission method 1200 according to an embodiment. The method 1200 includes the following steps.

1201: A first chip receives a second data stream sent by a second chip, where the second data stream is a concatenated FEC code stream obtained through encoding by using at least a first FEC code type and a second FEC code type.

1202: The first chip decodes the second data stream at least once, to form a first data stream, where the first data stream is a data stream obtained through encoding by using the first FEC code type.

1203: The first chip sends the first data stream to a third chip.

In some possible implementations, the first FEC code type is specifically: an RS code, a BCH code, a staircase code, an LDPC code, a Turbo code, or a TPC.

In some possible implementations, the second FEC code type is specifically: a BCH code, an RS code, a staircase code, an LDPC code, a Turbo code, or a TPC.

In some possible implementations, the first data stream is used to be decoded by the third chip based on the first FEC code type.

In some possible implementations, the second chip is located in a first data transmission device, the first chip and the third chip are located in a second data transmission device, the first chip is an electrical chip, the second chip is an electrical chip, and the third chip is a chip that uses an Ethernet interface.

It may be understood that the first chip is the chip 3 mentioned in the data transmission method 200, the second chip is the chip 1 mentioned in the data transmission method 200, and the third chip is the chip 4 mentioned in the data transmission method 200. Therefore, for various specific implementations of operations performed by the first chip, the second chip, and the third chip in this embodiment, refer to the descriptions of the chip 3, the chip 1, and the chip 4 in the data transmission method 200 shown in FIG. 2. Details are not described again in this embodiment.

In this embodiment, for the second data stream that is formed by concatenating at least the first FEC code type and the second FEC code type and that is sent by the second chip to the first chip, the first chip may decode the second data stream by using an FEC code type other than the first FEC code type, to form the first data stream that is obtained through encoding by using the first FEC code type, and send the first data stream to the third chip. In this way, the first chip does not need to decode the second data stream into original data, then encoding the original data into a data stream that is based on the first FEC code type, and send the data stream to the third chip. Therefore, an FEC code type conversion process is simplified, both a delay and device power consumption that are required during FEC code type conversion are reduced, and data transmission efficiency is improved.

Figure 13:
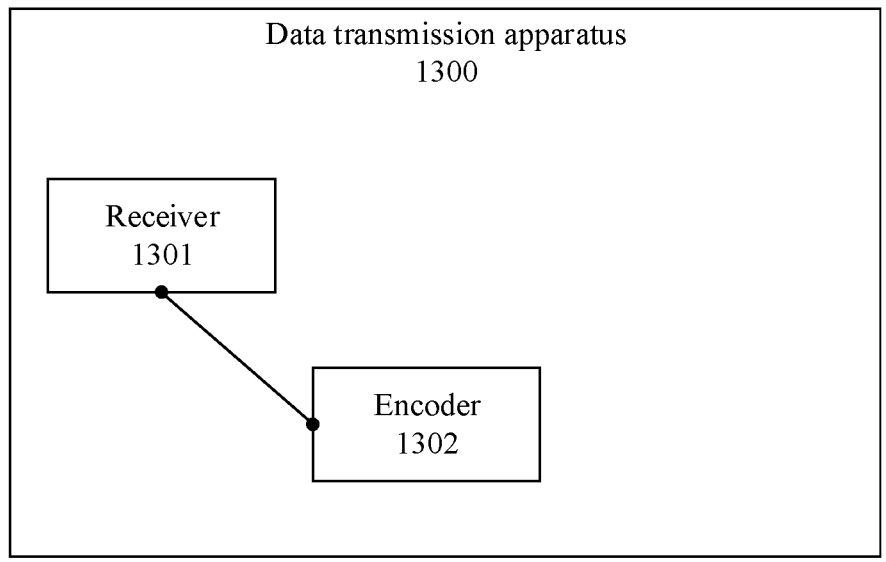
FIG. 13 is a schematic diagram of a structure of a data transmission apparatus according to an embodiment.

FIG. 13 is a schematic diagram of a structure of a data transmission apparatus 1300 according to an embodiment. The apparatus 1300 is a first chip and includes: a receiver 1301 configured to receive a first data stream sent by a second chip, where the first data stream is a data stream obtained through encoding by using a first FEC code type; and an encoder 1302 configured to encode the first data stream at least once, to obtain a second data stream, where the second data stream is a concatenated FEC code stream obtained through encoding by using at least the first FEC code type and a second FEC code type.

In some possible implementations, the first FEC code type is specifically: an RS code, a BCH code, a staircase code, an LDPC code, a Turbo code, or a TPC.

In some possible implementations, the second FEC code type is specifically: a BCH code, an RS code, a staircase code, an LDPC code, a Turbo code, or a TPC.

In some possible implementations, the encoder 1302 is further configured to: distribute the first data stream, to form n third data streams, where data of a same codeword block in the first data stream is distributed to different third data streams; and encode each of the plurality of third data streams at least once, to form the second data stream.

In some possible implementations, k codeword blocks identified from the first data stream are distributed to the n third data streams, and data that belongs to the k codeword blocks in each of the third data streams is encoded into one codeword block in the second data stream; and a total data volume included in the k codeword blocks in the first data stream is equal to a payload data volume included in n codeword blocks in the second data stream.

In some possible implementations, data in the first data stream is distributed by FEC symbol block, and data in a same FEC symbol block in the first data stream is encoded into a same codeword block in the second data stream.

In some possible implementations, data in the first data stream is distributed by bit stream, and data in the third data stream is encoded by bit stream.

In some possible implementations, the first chip and the second chip are located in a same data transmission device, the first chip is an electrical chip, and the second chip is a component that uses an Ethernet interface.

It may be understood that the apparatus 1300 shown in FIG. 11 is the chip 1 mentioned in the embodiment shown in FIG. 2. Therefore, for various specific implementations of the apparatus 1300 in this embodiment, refer to the description of the chip 1 in the embodiment shown in FIG. 2. Details are not described again in this embodiment.

In this embodiment, for the first data stream that is obtained through encoding by using the first FEC code type and that is sent by the second chip to the first chip, the first chip does not need to first decode the first data stream by using the first FEC code type and then encode original data into a concatenated FEC code. Instead, the first chip may encode the first data stream at least once by using at least the second FEC code type, to obtain the second data stream formed by concatenating at least the first FEC code type and the second FEC code type. Therefore, an FEC code type conversion process is simplified, both a delay and device power consumption that are required during FEC code type conversion are reduced, and data transmission efficiency is improved.

Figure 14:
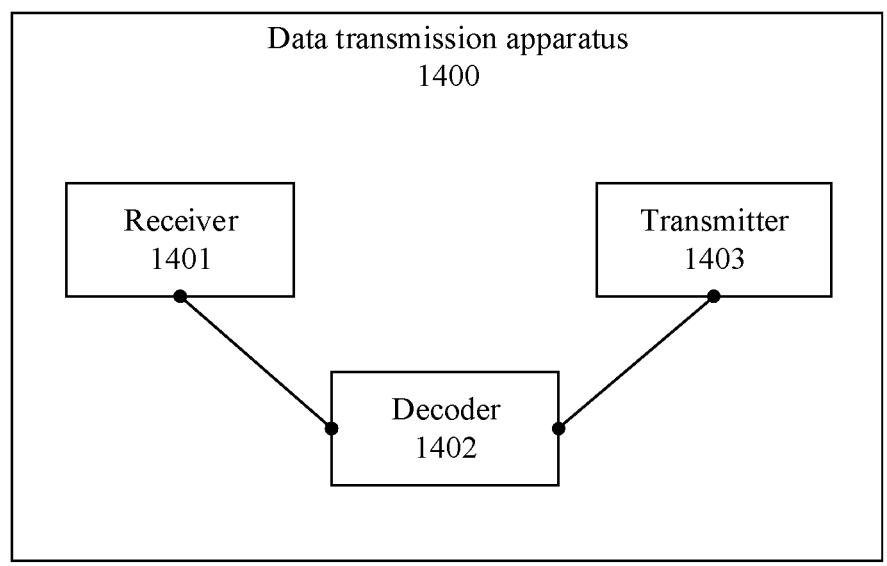
FIG. 14 is a schematic diagram of a structure of a data transmission method according to an embodiment.

FIG. 14 is a schematic diagram of a structure of a data transmission apparatus 1400 according to an embodiment. The apparatus 1400 is specifically a first chip and includes: a receiver 1401 configured to receive a second data stream sent by a second chip, where the second data stream is a concatenated FEC code stream obtained through encoding by using at least a first FEC code type and a second FEC code type; a decoder 1402 configured to decode the second data stream at least once, to form a first data stream, where the first data stream is a data stream obtained through encoding by using the first FEC code type; and a transmitter 1403 configured to send the first data stream to a third chip.

In some possible implementations, the first FEC code type is specifically: an RS code, a BCH code, a staircase code, an LDPC code, a Turbo code, or a TPC.

In some possible implementations, the second FEC code type is specifically: a BCH code, an RS code, a staircase code, an LDPC code, a Turbo code, or a TPC.

In some possible implementations, the first data stream is used to be decoded by the third chip based on the first FEC code type.

In some possible implementations, the second chip is located in a first data transmission device, the first chip and the third chip are located in a second data transmission device, the first chip is an electrical chip, the second chip is a chip, and the third chip is a component that uses an Ethernet interface.

It may be understood that the apparatus 1400 shown in FIG. 14 is the chip 3 mentioned in the embodiment shown in FIG. 2. Therefore, for various specific implementations of the apparatus 1400 in this embodiment, refer to the description of the chip 3 in the embodiment shown in FIG. 2. Details are not described again in this embodiment.

In this embodiment, for the second data stream that is formed by concatenating at least the first FEC code type and the second FEC code type and that is sent by the chip 1 to the chip 3, the chip 1 may decode the second data stream by using an FEC code type other than the first FEC code type, to form the first data stream that is obtained through encoding by using the first FEC code type, and send the first data stream to the chip 3. In this way, the chip 1 does not need to decode the second data stream into original data, then encoding the original data into a data stream that is based on the first FEC code type, and send the data stream to the chip 3. Therefore, an FEC code type conversion process is simplified, both a delay and device power consumption that are required during FEC code type conversion are reduced, and data transmission efficiency is improved.

In addition, an embodiment further provides a communication method. The communication method includes the foregoing data transmission method 1100 and the foregoing data transmission method 1200.

In addition, an embodiment further provides a communications system. The communications system includes the foregoing data transmission apparatus 1300 and the foregoing data transmission apparatus 1400.

In addition, an embodiment further provides a network device. The network device includes the foregoing data transmission apparatus 1300 or 1400.

In addition, an embodiment further provides a computer program product including instructions. When the computer program product is run on a computer, the computer is enabled to perform the data transmission method 1100 or 1200 in the method embodiments.

In addition, an embodiment further provides a computer-readable storage medium. The computer-readable storage medium stores instructions; and when the instructions are run on a computer or a processor, the computer or the processor is enabled to perform the data transmission method 1100 or 1200 in the method embodiments in the embodiments.

Ordinal numbers such as "1", "2", "3", "first", "second", and "third" in the embodiments are used to distinguish between a plurality of objects, but are not used to limit a sequence of the plurality of objects.

It can be learned from the foregoing descriptions of the implementations that, a person skilled in the art may clearly understand that a part or all of the steps of the methods in the foregoing embodiments may be implemented by using software and a universal hardware platform. Based on such an understanding, the technical solutions may be implemented in a form of a software product. The computer software product may be stored in a storage medium, for example, a read-only memory (ROM), random-access memory (RAM), a magnetic disk, or an optical disc, and include several instructions for instructing a computer device (which may be a personal computer, a server, or a network communications device such as a router) to perform the methods described in the embodiments or some parts of the embodiments.

The embodiments in this specification are all described in a progressive manner, for same or similar parts in the embodiments, refer to these embodiments, and each embodiment focuses on a difference from other embodiments. Especially, the apparatus embodiment is basically similar to the method embodiment, and therefore is described briefly. For related parts, refer to the description part of the method embodiment. The described device and system embodiments are merely examples. The modules described as separate parts may or may not be physically separate, and parts displayed as modules may or may not be physical modules, may be located in one position, or may be distributed on a plurality of network units. A part or all of the modules may be selected based on an actual requirement to achieve the objectives of the solutions of the embodiments. A person of ordinary skill in the art may understand and implement the embodiments without creative efforts.

The foregoing descriptions are merely example implementations, but are not intended to limit the protection scope of this disclosure.

What is claimed is:

1. A method comprising:
   receiving, by a first chip of an optical module, from a second chip outside of the optical module, and through a physical lane, a first data stream encoded with a first forward error correction (FEC) code; and
   encoding, by the first chip and without decoding the first FEC code, the first data stream with a second FEC code to obtain a second data stream,
   wherein the second data stream is a concatenated FEC code stream based on a concatenation of the first FEC code and the second FEC code, and
   wherein encoding the first data stream to obtain the second data stream comprises:
      distributing, by the first chip, the first data stream to obtain n third data streams, wherein n is a natural number greater than 1, and wherein data of a codeword in the first data stream is distributed to different third data streams; and
      encoding, by the first chip, each of the n third data streams with the second FEC code to obtain the second data stream.

2. The method of claim 1, wherein the first FEC code is a Reed-Solomon (RS) code, a Bose-Chaudhuri-Hocquenghem (BCH) code, a staircase code, a low-density parity check (LDPC) code, a turbo code, or a turbo product code (TPC).

3. The method of claim 1, wherein the second FEC code is a Reed-Solomon (RS) code, a Bose-Chaudhuri-Hocquenghem (BCH) code, a staircase code, a low-density parity check (LDPC) code, a turbo code, or a turbo product code (TPC).

4. The method of claim 1, wherein distributing the first data stream comprises distributing k codewords from the first data stream to the n third data streams, wherein k is a natural number greater than 1, wherein encoding each of the n third data streams comprises encoding data that belong to the k codewords into one codeword in the second data stream, and wherein a total data volume comprised in the k codewords in the first data stream is equal to a payload data volume comprised in n codewords in the second data stream.

5. The method of claim 1, wherein data in the first data stream is distributed at a symbol granularity, and wherein data in an FEC symbol in the first data stream is encoded into a codeword in the second data stream.

6. The method of claim 1, wherein data in the first data stream are distributed at a bit granularity.

7. The method of claim 1, wherein the first chip and the second chip are located in a same data transmission device.

8. The method of claim 1, wherein the first chip is a digital signal processing (DSP) chip.

9. The method of claim 1, wherein encoding the first data stream comprises performing, by the first chip, interleaving or multiplexing on the first data stream.

10. The method of claim 1, wherein the first FEC code is a Reed-Solomon (RS) code, and wherein the second FEC code is a Bose-Chaudhuri-Hocquenghem (BCH) code.

11. An apparatus, wherein the apparatus is an optical module or a first chip in the optical module, and wherein the apparatus comprises:
   a receiver configured to receive, through a physical lane and from a second chip outside of the optical module, a first data stream encoded with a first forward error correction (FEC) code; and
   an encoder configured to encode, without decoding the first FEC code, the first data stream with a second FEC code to obtain a second data stream,
   wherein the second data stream is a concatenated FEC code stream based on a concatenation of the first FEC code and the second FEC code, and
   wherein to encode the first data stream, the encoder is further configured to:

distribute the first data stream to obtain n third data streams, wherein n is a natural number greater than 1, and wherein data of a codeword in the first data stream is distributed to different third data streams; and encode each of the n third data streams with the second FEC code to obtain the second data stream.

12. The apparatus of claim 11, wherein the first FEC code is a Reed-Solomon (RS) code, a Bose-Chaudhuri-Hocquenghem (BCH) code, a staircase code, a low-density parity check (LDPC) code, a turbo code, or a turbo product code (TPC).

13. The apparatus of claim 11, wherein the second FEC code is a Reed-Solomon (RS) code, a Bose-Chaudhuri-Hocquenghem (BCH) code, a staircase code, a low-density parity check (LDPC) code, a turbo code, or a turbo product code (TPC).

14. The apparatus of claim 11, wherein to distribute the first data stream, the encoder is further configured to distribute k codewords from the first data stream to the n third data streams, wherein to encode each of the n third data streams, wherein k is a natural number greater than 1, the encoder is further configured to encode data that belong to the k codewords into one codeword in the second data stream, and wherein a total data volume comprised in the k codewords in the first data stream is equal to a payload data volume comprised in n codewords in the second data stream.

15. The apparatus of claim 11, wherein data in the first data stream is distributed at a symbol granularity, and wherein data in an FEC symbol in the first data stream is encoded into a codeword in the second data stream.

16. The apparatus of claim 11, wherein data in the first data stream are distributed at a bit granularity.

17. The apparatus of claim 11, wherein the first chip and the second chip are located in a same data transmission device.

18. The apparatus of claim 11, wherein the first chip is a digital signal processing (DSP) chip.

19. The apparatus of claim 11, wherein the encoder is further configured to encode the first data stream by performing interleaving or multiplexing on the first data stream.

20. The apparatus of claim 11, wherein the first FEC code is a Reed-Solomon (RS) code, and wherein the second FEC code is a Bose-Chaudhuri-Hocquenghem (BCH) code.

21. The apparatus of claim 11, wherein data in an FEC symbol in the first data stream is encoded into a codeword in the second data stream.

22. A data transmission device comprising:
a physical lane;
a chip configured to send, through the physical lane, a first data stream encoded with a first forward error correction (FEC) code; and
an optical module disposed separate from the chip and configured to:
receive, from the chip, the first data stream; and
encode, without decoding the first FEC code, the first data stream with a second FEC code to obtain a second data stream, wherein the second data stream is a concatenated FEC code stream based on a concatenation of the first FEC code and the second FEC code, and wherein to encode the first data stream, the optical module is further configured to:
distribute the first data stream to obtain n third data streams, wherein n is a natural number greater than 1, and wherein data of a codeword in the first data stream is distributed to different third data streams; and encode each of the n third data streams with the second FEC code to obtain the second data stream.

23. The data transmission device of claim 22, wherein the first FEC code is a Reed-Solomon (RS) code, and wherein the second FEC code is a Bose-Chaudhuri-Hocquenghem (BCH) code.

24. The data transmission device of claim 22, wherein data in the first data stream is distributed at a symbol granularity or a bit granularity.

25. The data transmission device of claim 24, wherein the first FEC code is a Reed-Solomon (RS) code, and wherein the second FEC code is a Bose-Chaudhuri-Hocquenghem (BCH) code.

26. The data transmission device of claim 22, wherein the first FEC code is a Reed-Solomon (RS) code, a Bose-Chaudhuri-Hocquenghem (BCH) code, a staircase code, a low-density parity check (LDPC) code, a turbo code, or a turbo product code (TPC).

27. The data transmission device of claim 22, wherein the second FEC code is a Reed-Solomon (RS) code, a Bose-Chaudhuri-Hocquenghem (BCH) code, a staircase code, a low-density parity check (LDPC) code, a turbo code, or a turbo product code (TPC).

28. The data transmission device of claim 22, wherein the optical module is further configured to:
distribute the first data stream by distributing k codewords from the first data stream to the n third data streams, wherein k is a natural number greater than 1; and
encode each of the n third data streams by encoding data that belong to the k codewords into one codeword block in the second data stream, and
wherein a total data volume comprised in the k codewords in the first data stream is equal to a payload data volume comprised in n codewords in the second data stream.

29. The data transmission device of claim 22, wherein data in an FEC symbol in the first data stream is encoded into a codeword in the second data stream.

30. The data transmission device of claim 22, wherein the optical module is further configured to encode the first data stream by performing interleaving or multiplexing on the first data stream.

31. The data transmission device of claim 22, wherein data in the first data stream is distributed at a symbol granularity, and wherein data in an FEC symbol in the first data stream is encoded into a codeword in the second data stream.

* * * * *